United States Patent [19]

Mastner

[11] 3,916,297

[45] Oct. 28, 1975

[54] CIRCUIT ARRANGEMENT FOR INCREASING THE EFFECTIVE CAPACITANCE OF A CAPACITOR

[75] Inventor: Jiri Mastner, Niederrohrdorf, Switzerland

[73] Assignee: BBC Brown Boveri & Company Limited, Baden, Switzerland

[22] Filed: Aug. 14, 1973

[21] Appl. No.: 388,083

[30] Foreign Application Priority Data

Aug. 29, 1972 Switzerland ....................... 12719/72

[52] U.S. Cl. .................. 323/93; 307/293; 333/80 R; 330/69

[51] Int. Cl.[2] .......................................... H03H 11/00

[58] Field of Search ..... 323/93, 76; 333/80 R, 80 T; 307/293; 330/109, 69

[56] References Cited

UNITED STATES PATENTS

| | | | |
|---|---|---|---|
| 3,440,451 | 4/1969 | Honig | 307/293 |
| 3,551,846 | 12/1970 | Hansen et al. | 333/80 T |
| 3,553,609 | 1/1971 | Edge | 333/80 T |
| 3,564,441 | 2/1971 | Eide | 330/109 X |
| 3,702,405 | 11/1972 | Zwirn et al. | 333/80 T |
| 3,831,117 | 8/1974 | Fletcher et al. | 330/69 X |

*Primary Examiner*—Gerald Goldberg
*Attorney, Agent, or Firm*—Pierce, Scheffler & Parker

[57] ABSTRACT

An arrangement wherein for increasing the effective capacitance of a capacitor included in an electrical circuit such as, for example, a resonant circuit for the purpose of detuning the latter, a current amplifier having a high output impedance and a low input impedance is connected in parallel with the capacitor whereby the effective capacitance appears between the output and a reference potential of the current amplifier.

17 Claims, 4 Drawing Figures

CIRCUIT ARRANGEMENT FOR INCREASING THE EFFECTIVE CAPACITANCE OF A CAPACITOR

Figure 1:
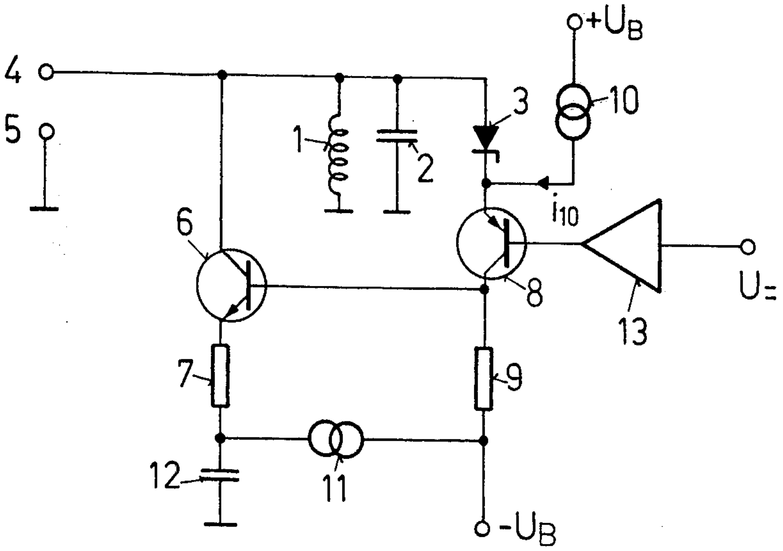

The present invention relates to an improved circuit arrangement for increasing the effective capacitance of a capacitor such as for example a capacitance diode. For detuning of resonant circuits, which can be defined as changing the resonant frequency of the circuit to a new value, by d.c. tuning voltages applied from outside, capacitance diodes, which are obtainable in a wide selection of capacitance values from a few picofarads up to a few 100 pF, are used in the radio-frequency art (Elektronik 1970, number 8, pages 257 and 258).

A tuning voltage is required in order to adjust the capacity of the capacitance diode, which is functionally related to the voltage, to the desired value. Since the effective capacity of the entire circuit is directly proportional to the capacitance of the diode, as is self-evident from equations (1) to (4) which follow hereinafter, the entire effective capacity of the circuit will be adjusted by the tuning voltage.

Capacitance diodes are only suitable to a limited extent for the detuning of low-frequency resonant circuit for which the tuning capacitances needed may be higher by some orders of magnitude. In an emergency, standard power diodes or Zener diodes may be used (as a substitute for capacitance diodes with high capacitance values which are not at hand). Their junction capacitance and the dependence of the junction capacitance on the applied d.c. voltage is neither given in the manufactuer's specification sheets, however, nor can the manufacturer guarantee the adherence to specific values.

Variable capacitors of high capacitance or with a wide variation in capacitance are frequently needed in electrical circuits, for example low-frequency oscillators, variable filters etc. Such capacitors can only be realized with reasonable expense up to specific capacitance values, however.

It is therefore the object of the invention to overcome the disadvantages in what was known and to indicate a means whereby the capacitance of conventional capacitors, whether they be capacitors with fixed or variable capacitance values, can be enlarged.

The invention is based on the following consideration: A capacitance in a circuit is characterized by the phase displacement of 90° between current and voltage and their relationship to one another. Now in any circuit, the current flowing through a capacitor can only be increased by increasing the applied voltage. Upper limits are imposed on this procedure, however, particularly with capacitance diodes.

In order to solve the above-mentioned problem, in a circuit arrangement for increasing the effective capacitance of a capacitor it is proposed that a current amplifier with a high output impedance and low input impedance should be connected in parallel with the capacitor, the effective capacitance appearing between the output and the reference point (earth) of the current amplifier.

The invention is explained in more detail below with reference to examples of embodiment illustrated in the drawings.

In the drawings

Figure 2:
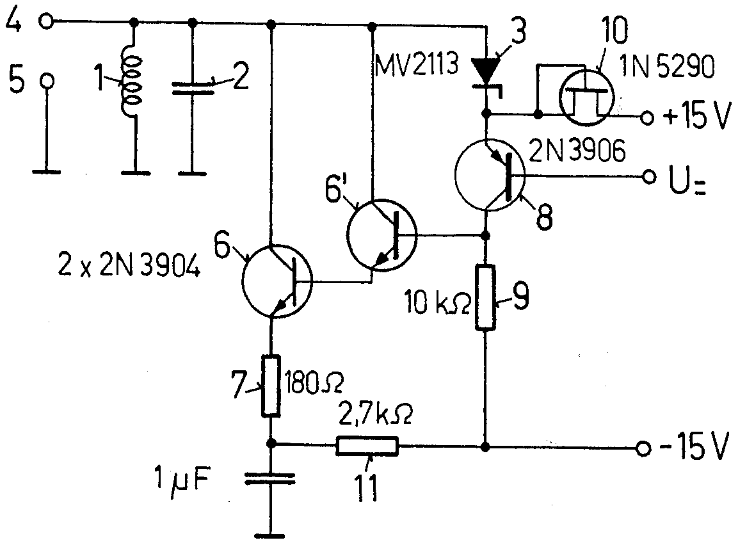
Figure 3:
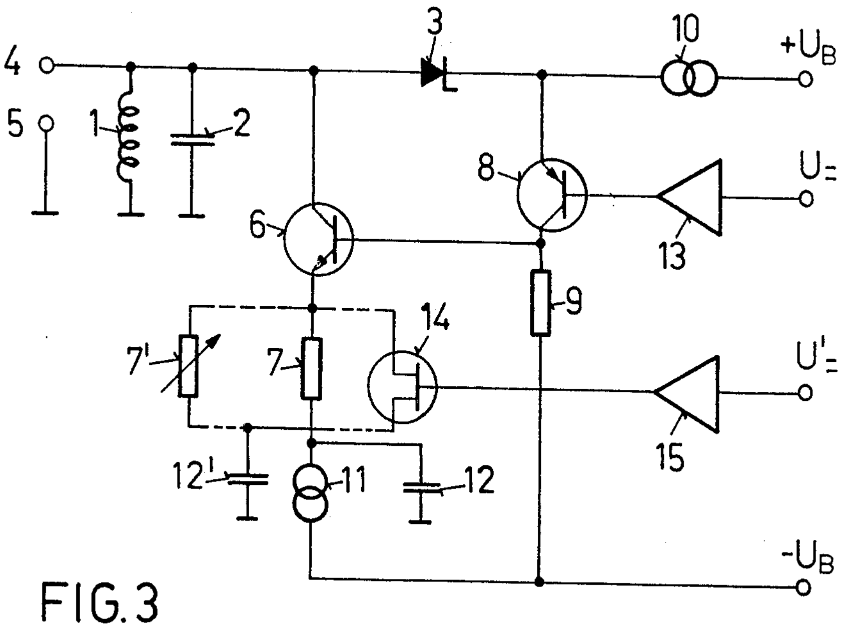
Figure 4:
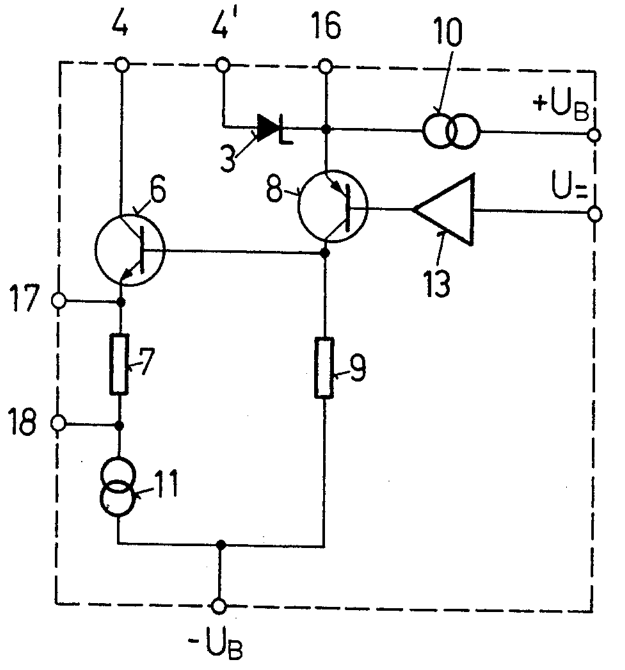

FIG. 1 shows a first basic example of an embodiment of a circuit arrangement for increasing the effective capacitance of a capacitor, FIG. 2 shows a practical example of an embodiment of such a circuit arrangement, FIG. 3 shows one of the circuit arrangements illustrated in FIG. 1 with an extended possibility for adjusting the capacitance values, and FIG. 4 shows an example of an embodiment of the invention in the form of a circuit which can be integrated monolithically.

The invention will first be explained with reference to the basic circuit diagram illustrated in FIG. 1. The resonant circuit to be detuned to a new resonant frequency consists of a coil 1 and a capacitor 2. 3 designates a capacitance diode with a relatively low capacitance or variation in capacitance which is not sufficient for the desired detuning. The terminals 4 and 5 form the signal connections of the circuit. A series connection, consisting of the emitter-collector space of a first transistor 6, a first resistor 7 and a current source 11, lies between the "hot" terminal 4 and the negative supply voltage —$^{h}$d B. The connecting line between resistor 7 and the current source 11 is earthed by means of a capacitor 12 as regards a.c. voltage. The emitter-collector space of a second transistor 8 and a second resistor 9 lie between the capacitance diode 3 and the negative supply voltage $-U_B$. The base of the transistor 6 is connected to the collector of the transistor 8, to the base of which the tuning voltage $U_=$ is supplied. A current source 10 connected to a positive supply voltage denoted by $+ U_B$ injects a constant current $i_{10}$ into the emitter of the transistor 8 and makes the collector potential of this transistor independent of the tuning voltage $U_=$ applied at the base. The constant current source 10 determines the d.c. operating point of transistor 8 because as is well known the same current must flow substantially within the collector circuit as does within the emitter circuit. The use of a constant current source offers two advantages, these being 1) there is no additional load on the capacitance diode 3 and 2) a constant voltage drop across resistor 9, irrespective of the control voltage $U_=$ contributes to a proper definition of the operating point of transistor 6 and prevents non-linear distortion within this stage. If this tuning voltage has a constant value, then the current source 10 can be replaced by a resistor, for example when a (variable) capacitor replaces the capacitance diode 3.

Together with the resistors 7 and 9 and the current source 10, the transistors 6 and 8 form a current amplifier with a high output impedance and low input impedance. The transistor 6 is operated with a common-emitter connection, the transitor 8 with a common-base connection. Attention is drawn to the fact that such a current amplifier has nothing in common with the emitter-follower circuits or voltage-follower circuits which are usually termed current amplifiers, because reversed impedance conditions are always present in the latter; emitter-followers or voltage-followers have a high impedance and low output impedance.

It is obvious that the invention can also be realized with reversed polarities or types of conductivity of the transistors. The transistors 6 and 8 should then be replaced by those of the reversed type of conductivity, and the polarity of the capacitance diode 3 and the polarities of the supply voltages should be reversed.

Darlington pairs or operational amplifiers may also be used instead of an individual transistor 6 and/or 8. In the case where the transistor 6 is replaced by an operational amplifier, one with current output should be used.

With an a.c. voltage $U_{LC}$ extending across the terminals 4 and 5, the latter being at ground potential of the resonant circuit, a current $$i_8 = U_{LC}/(1/pC_3 + r_{e8}) \qquad (1)$$

flows in the emitter of the transistor 8, in which $C_3$ signifjes the capacitance of the capacitance diode 3 and $r_{e8}$ the emitter-input resistance of the transistor 8. Since transistor 8 operates as a common base for the signal voltage $U_{LC}$ all components which are connected to its emitter are thus effectively grounded by way of the emitter input resistance, and diode 3 is placed voltagewise between terminals 4 and 5, i.e. parallel to the resonant circuit 1, 2. There is no distribution of $U_{LC}$ by way of other components such as transistor 8, base-emitter of transistor 6, resistor 7 or capacitor 12 because the collectors at the base lines of transistors 6 and 8 completely isolate the voltage drops across resistors 9 and 7 from the resonant circuit.

On the assumption that the input resistance of the transistor 6 is much higher than the resistor 9, and the transistor 6 has a high current amplification — both conditions can easily be realized, for example by a pair of transistors in a Darlington connection in each case — a voltage $$U_9 = R_9 \cdot i_8 = U_{LC} \cdot pC_3 \cdot R_9/(pC_3 \cdot r_{e8} + 1) \qquad (2)$$

develops across the resistor 9. With a sufficiently high resistance $R_7$, $h_{11}$ and $h_{22}$ of the transistor 6 can be ignored in the first approximation. Thus there is a collector current $i_6$ of the transistor 6 of $$i_6 = U_7/R_7 = (U_9/R_7) \cdot pC_3 \cdot R_9/(pC_3 \cdot r_{e8} + 1) \qquad (3)$$

The collector output impedance $Z_6$ of the transistor 6 amounts to $$U_{LC}/i_6 = 1/(pC_3 \cdot (R_9/R_7)) + (R_7/R_9) \cdot r_{e8}. \qquad (4)$$

Thus at the collector of the transistor 6 and (hence also at the input terminal 4), the circuit behaves like a capacitance $C_3 \cdot (R_9/R_7)$ with a resistance of the magnitude $r_{e8} \cdot (R_7/R_9)$ in series.

Thus the capacitance $C_3$ of the capacitance diode 3 has been multiplied by the factor $(1 + R_9/R_7)$ that is to say enlarged.

$$Q = 1/\omega C_3 r_{e8} \qquad (5)$$

then results for the quality of the equivalent capacitance if all phase shifts in the amplifier can be ignored.

Since at the lower frequencies at which the advantages of the invention are particularly noticeable, the reactance of the capacitance diode 3 is high and $r_{e8}$ can be kept within the order of magnitude of a few ohms by the selection of the current $i_{10}$, a quality factor Q of several 10 up to 100 is obtained as a result.

The tuning voltage $U_=$ for the capacitance diode 3 can be supplied, with advantage, to the base of the transistor 8, as a result of which there is a hard injection, that is to say short time constant, negligible influence of the residual current of the diode. A short time constant of the control circuit will be required in the case where detuning of the resonant circuit needs to be accomplished rapidly, the time constant being determined by the capacity of the diode 3 and the effective resistance of the decoupling impedance, the latter being required in order to overcome damping of the resonant circuit by the control voltage source. Transistor 8 functions as the decoupling component with a very low output impedance in the emitter circuit resulting in a short time constant. A further advantage is to be seen in the fact that as a result an at least partial compensation for the temperature variation of the capacitance of the diode 3 is achieved because the temperature coefficient of the diode is positive (rising capacitance with increasing temperature) and that of the base-emitter voltage of the transistor 8 is negative, so that with risng temperatures, the d.c. voltage across the capacitance diode 3 rises and counter acts a variation in capacitance — caused by its positive temperature coefficient. That is to say, the temperature induced change in capacity of diode 3 is countered by an increase in the control voltage since the capacity of this diode is lowered if the control voltage is increased and this takes place automatically because the voltage drop across the diode equals the base voltage minus the voltage drop from base to emitter, and because the voltage drop from the base to emitter decreases with rising temperature.

The tuning sensitivity (ratio of variation in capacitance to variation in tuning voltage) of the circuit arrangement according to FIG. 1 can be increased by a control voltage amplifier (for example an operational amplifier) 13 preceding the the transistor 8. This amplifier can serve to fix the working frequency of the resonant circuit at a desired value with the control voltage zero, at the same time.

In the specific example of an embodiment of a circuit arrangement for increasing the effective deturning capacitance of diode 3, illustrated in FIG. 2, an enlargement of the effective capacitance by a factor of 50, i.e. a large number of multiples of its original value, was achieved with the components itemized there. According to the specification sheet of the manufacturer, the capacitance of the capacitance diode 3 (MV 2113) amounts to about 60 pF with $U_= = +6$ volts. As a result of the proposed circuit arrangement, the effective capacitance between the output of the current amplifier and earth increased to about 3,000pF. The working frequence was 50 kHz.

The invention is naturally not restricted to increasing the capacitance of capacitance diodes. If the capacitance diode 3 in the circuit arrangement shown in FIG. 1 is replaced by a conventional variable capacitor, then its capacitance or its range of variation in capacitance can likewise be increased linearly. In this case, the base of the transistor 8 can be connected to a fixed potential, for example earth potential. The change which can be achieved is again determined by the ratio $R_9/R_7$. The capacitor used must be insulated.

The proposed circuit arrangement can be used to advantage wherever variable capacitors (more generally: mechanically variable capacitors) can no longer be used for economic reasons or because of lack of space, for example in variable low-frequency filters, oscillators etc.

The circuit arrangement illustrated in FIG. 3 offers an extended possibility for adjustment in comparison with the examples of embodiment illustrated in FIGS. 1 and 2:

By means of the tuning voltage $U_=$ supplied to the base of the transistor 8, possibly through the operational amplifier 13, the working point and the (in itself) effective capacitance value of the capacitance diode 3 are determined. The degree of enlargement of this capacitance is adjusted by altering the resistor 7. This is again possible in two ways: By connecting a resistor or potentiometer 7', in series with a capacitor 12', in parallel with the resistor 7 as regards a.c. voltage or by the fact that a resistor which can be controlled electronically, for example a field effect transistor 14, which is controlled for example by a further amplifier 15 (likewise indicated in broken lines), is connected in parallel with the resistor 7 as regards a.c. voltage.

Through the very advanced technology of integrated circuits, it is possible to produce a circuit arrangement as shown in FIGS. 1 and 3 in the form of a monolithically integrated circuit or in the form of a hybrid circuit.

This is demonstrated in the example of an embodiment illustrated in FIG. 4. This corresponds largely to that of FIG. 1 but has the following peculiarities:

The connection from the output of the current amplifier to the capacitance diode 3 is not effected internally but both connections 4 and 4' are taken to the outside. This has the advantage that, when the built-in capacitance diode is used, only the connections between the terminals 4 and 4' has to be established, whereas when the circuit with a variable capacitor and the like is used, this has to be connected to the terminal 4 (output of the current amplifier) and its input 16 (emitter of the transistor 8), the built-in capacitance diode remaining unused.

Also, the two ends of the resistor 7 are taken to the two terminals 17 and 18, as a result of which the possibility is afforded of adjusting the factor of the increase in capacitance by connecting a variable resistor in parallel as regards a.c. voltage (see FIG. 3). In addition, the terminal 18 serves for the connecting up of the necessary capacitor 12.

In the examples of embodiment as shown in FIGS. 1, 3 and 4, the control voltage amplifier 13 can be designed in such a manner that the characteristic of the capacitance diode is influenced in the desired manner. Usually, in capacitance diodes, there is no linear relationship between tuning voltage and capacitance. The same applies to the relationship between resonance frequency (of a resonant circuit equipped with such diodes) and tuning voltage. With the circuit means known from the analog art, the characteristic of an operational amplifier (input voltage/output voltage characteristic curve) can now be selected so that there is a linear, exponential or other relationship between the tuning voltage $U_=$ supplied to the control voltage amplifier 13 and the change in capacitance resulting therefrom.

I claim:

1. Apparatus for detuning a resonant circuit having a natural resonant frequency established by interconnected inductance and capacitance elements having fixed reactance values to a different resonant frequency comprising a detuning capacitor connected into said resonant circuit and means for increasing the effective capacitance of said detuning capacitor by a factor equal to a large number of multiples of its original value comprising a current amplifier having a high output impedance and a low input impedance connected in parallel with said detuning capacitor, whereby effective capacitance appears between the said output and a reference potential of said current amplifier.

2. A circuit arrangement as defined in claim 1, wherein said current amplifier is composed of at least a first and a second three-terminal amplifier, of which the second three-terminal amplifier has the current flowing through the detuning flowing through it and said first three-terminal amplifier is controlled by said current.

3. A circuit arrangement as defined in claim 2, wherein said first three-terminal amplifier is operated with a common-emitter connection and the second three-terminal amplifier with a common-base connection.

4. A circuit arrangement as defined in claim 2, wherein said detuning capacitor is a capacitance diode and a detuning voltage for the capacitance diode is supplied to the control connection of said second three-terminal amplifier.

5. A circuit arrangement as defined in claim 4, and which further includes a control voltage amplifier to increase the tuning sensitivity of said capacitance diode.

6. A circuit arrangement as defined in claim 4 and which further includes a control voltage amplifier to influence the characteristic of said capacitance diode.

7. A circuit arrangement as defined in claim 4, and which further includes a control voltage amplifier to fix the working point of said capacitance diode.

8. A circuit arrangement as defined in claim 1 wherein the current amplification factor of said current amplifier is adjustable for the linear enlargement of the capacitance.

9. A circuit arrangement as defined in claim 1, wherein one end of said detuning capacitor is connected to the collector of a first transistor forming the output of said current amplifier, and the other end thereof is connected to the emitter of a second transistor forming the input of said current amplifier and to a current source, the base connection of said first transistor being connected to the collector of said second transistor and through a first resistor to a first supply voltage, the emitter of said first transistor being connected through a second resistor to a second supply voltage, and the output of said current amplifier and said reference potential of the supply voltage are those terminals between which the capacitance of said detuning capacitor appears, multiplied substantially by the factor $(1 + R_9/R_7)$, wherein $R_9$ signifies the resistance value of said first resistor and $R_7$ the resistance value of said second resistor.

10. A circuit arrangement as defined in claim 9, wherein said first and second resistors are variable.

11. A circuit arrangement as defned in claim 9, wherein said first resistor is variable.

12. A circuit arrangement as defined in claim 9, wherein said second resistor is variable.

13. A circuit arrangement as defined in claim 1 wherein said current amplifier is constructed by the integrated or hybrid circuit technique.

14. A circuit arrangement as defined in claim 1, wherein one end of said detuning capacitor is connected to the collector of a first transistor forming the output of said current amplifier, and the other end thereof is connected to the emitter of a second transistor forming the input of said current amplifier and to a current source, the base connection of said first transistor being connected to the collector of said second transistor and through a first resistor to a first supply voltage, the emitter of said first transistor being connected through said second resistor and a second current source connected in series therewith to said first supply voltage, and the output of said current amplifier and said reference potential of the supply voltage are those terminals between which the capacitance of said detuning capacitor appears, multiplied substantially by the factor $(1 + R_9/R_7)$, wherein $R_9$ signifies the resistance value of said first resistor and $R_7$ the resistance value of said second resistor.

15. A circuit arrangement as defined in claim 14, wherein said first and second resistors are variable.

16. A circuit arrangement as defined in claim 14, wherein said first resistor is variable.

17. A circuit arrangement as defined in claim 14, wherein said second resistor is variable.

* * * * *

UNITED STATES PATENT OFFICE
CERTIFICATE OF CORRECTION

PATENT NO. : 3,916,297
DATED : October 28, 1975
INVENTOR(S) : Jiri Mastner

It is certified that error appears in the above-identified patent and that said Letters Patent are hereby corrected as shown below:

Claim 2, line 5, after "detuning" insert:

- capacitor -

Signed and Sealed this

*third* Day of *February 1976*

[SEAL]

*Attest:*

RUTH C. MASON
*Attesting Officer*

C. MARSHALL DANN
*Commissioner of Patents and Trademarks*